United States Patent [19]

Furuyama et al.

[11] 4,404,657
[45] Sep. 13, 1983

[54] SEMICONDUCTOR MEMORY CIRCUIT

[75] Inventors: Tohru Furuyama, Yokohama; Tetsuya Iizuka, Kawasaki, both of Japan

[73] Assignee: Tokyo Shibaura Denki Kabushiki Kaisha, Kawasaki, Japan

[21] Appl. No.: 197,564

[22] Filed: Oct. 16, 1980

[30] Foreign Application Priority Data

Oct. 19, 1979 [JP] Japan .................................. 54-134904

[51] Int. Cl.³ .............................................. G11C 11/40
[52] U.S. Cl. .................................................... 365/154
[58] Field of Search ......................................... 365/154

[56] References Cited

U.S. PATENT DOCUMENTS

| | | | |
|---|---|---|---|
| 3,191,061 | 6/1965 | Weimer | 357/59 |
| 3,447,137 | 5/1969 | Feuer | 365/154 |
| 3,644,907 | 2/1972 | Gricchi et al. | 340/173 FF |
| 3,813,653 | 5/1974 | Smith et al. | 365/227 |
| 4,134,151 | 1/1979 | O'Connell et al. | 365/154 |

OTHER PUBLICATIONS

IBM Technical Disclosure Bulletin, vol. 23, No. 1, Jun. 1980, pp. 180–186, Memory Cell Adapted for Different Combinations of Simultaneous Read and Write Operations, J. R. Cavaliere et al.
IBM Technical Disclosure Bulletin, vol. 14, No. 6, Nov. 1971, p. 1693, Storage Cell With Single Bit Line, R. D. Moore.
Roger G. Stewart and Andrew G. F. Dingwall, *16K CMOS/SOS Asynchronous Static RAM,* 1979 IEEE International Solid-State Circuits Conference, Digest of Technical Papers, pp. 104–105, (Feb. 15, 1979).

*Primary Examiner*—George G. Stellar
*Attorney, Agent, or Firm*—Finnegan, Henderson, Farabow, Garrett, and Dunner

[57] ABSTRACT

A semiconductor memory circuit includes a power supply terminal; a first MOS transistor; a second MOS transistor whose source, gate and drain are respectively connected to the source, drain and gate of the first MOS transistor; first and second resistors connected between the power supply terminal and the drains of the first and second MOS transistors; a data line; a word line; and a third MOS transistor whose current path is connected between the drain of the first MOS transistor and data line, and whose gate is connected to the word line. The semiconductor memory circuit further includes a write control line whose potential is set at a high level when a readout operation is effected. The sources of the first and second MOS transistors are jointly connected to the write control line.

6 Claims, 22 Drawing Figures

SEMICONDUCTOR MEMORY CIRCUIT

This invention relates to a semiconductor memory circuit for statically storing data.

In recent years, various improvements have been attempted on a semiconductor memory device in order to satisfactorily attain the object of ensuring its high speed operation, high integration and low power consumption. The semiconductor memory device is broadly classified into the static memory type and dynamic memory type. With the dynamic memory, leakage current flows through semiconductor elements constituting memory cells. Data stored in the memory cells may be destroyed after a prescribed length of time, making it necessary to periodically refresh stored data. In contrast, a static memory enables data to remain safely stored, as long as a power source voltage is supplied to a static memory. However, the static memory cell has to be provided with a bistable circuit in order to sustain such stable storing action. Consequently, a larger number of semiconductor elements have to be provided to form one memory cell, presenting difficulties in producing a highly integrated version of a semiconductor memory device.

FIGS. 1 and 2 show the arrangements of resistor type NMOS memory cells used with the conventional static memory cell device. With these prior art memory cells, MOS transistors 2 and 4 are so connected as to provide a flip-flop circuit. The bistable output terminals of the flip-flop circuit are respectively connected to data lines DL and $\overline{DL}$ through the corresponding transistors 6 and 8. The memory cell of FIG. 2 is provided with high load resistors 14 and 16 prepared from, for example, polycrystalline silicon in place of the load MOS transistors 10, 12 applied in the memory cell of FIG. 1. The memory cell of FIG. 2 is more advantageous over that of FIG. 1 in that the high load resistors minimize leakage current running between the power source terminal $V_D$ and ground. Also, only four MOS transistors have to be used. However, even the memory cell of FIG. 2 still has the drawbacks that at least four MOS transistors have to be provided, and it is also necessary to use five conductive lines, that is, two power supply lines, two data lines and one word line, presenting great difficulties in manufacturing such type of semiconductor memory device with a high integration degree.

It is accordingly the object of this invention to provide a semiconductor memory circuit which allows for a decrease in the number of MOS transistors and wires required for the fabrication of a semiconductor memory device.

According to an aspect of the invention, there is provided a semiconductor memory circuit which comprises at least one word line; at least one data line; at least one control voltage line; and at least one memory cell including a first MOS transistor whose source is connected to the control voltage line, a second MOS transistor whose drain and gate are connected to those of the first MOS transistor and whose source is connected to the control voltage line, first and second load resistor means respectively connected to the drains of the first and second MOS transistors, and a third MOS transistor whose gate is connected to the word line and whose current path is connected between the drain of the first MOS tansistor and the data line.

This invention can be more fully understood from the following detailed description when taken in conjunction with the accompanying drawings, in which.

Figure 1:
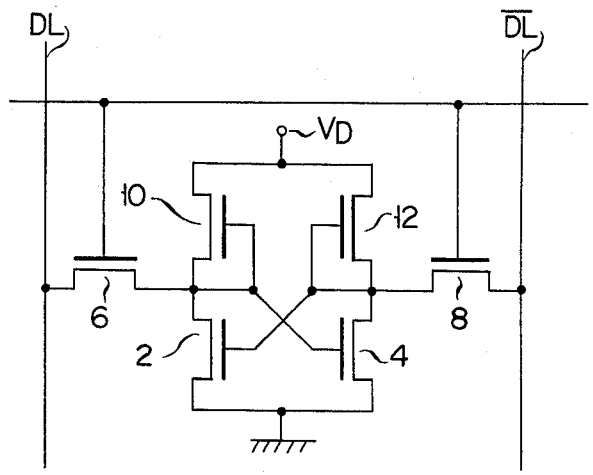
FIGS. 1 and 2 are the circuit diagrams of prior art flip-flop circuits respectively constituting a semiconductor memory cell.
Figure 2:
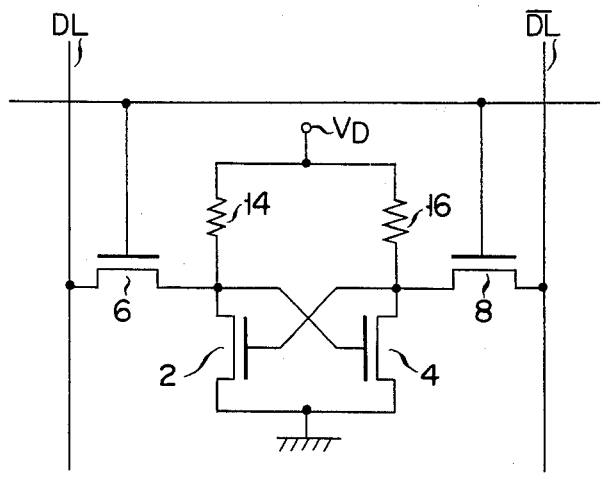
Figure 3:
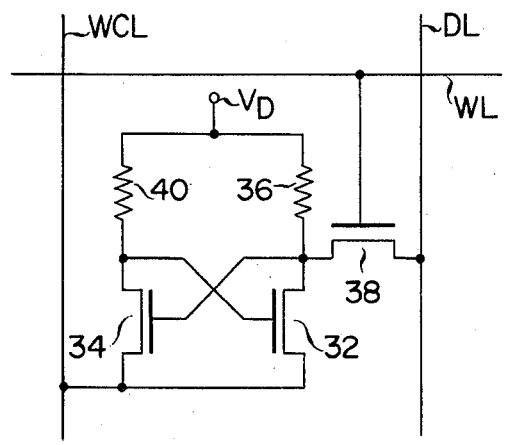
FIG. 3 is a circuit diagram of a semiconductor memory circuit embodying this invention.
Figure 6:
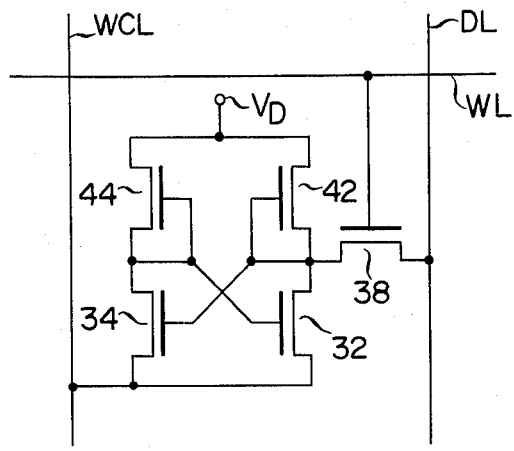

FIGS. 4A to 4E set forth voltage waveforms illustrating the read operation of the semiconductor memory circuit of FIG. 3;

FIGS. 5A to 5L indicate voltage waveforms illustrating the write operation of the semiconductor memory cell circuit of FIG. 3;

FIG. 6 is a modification of the semiconductor memory circuit of FIG. 3; and

Figure 7:
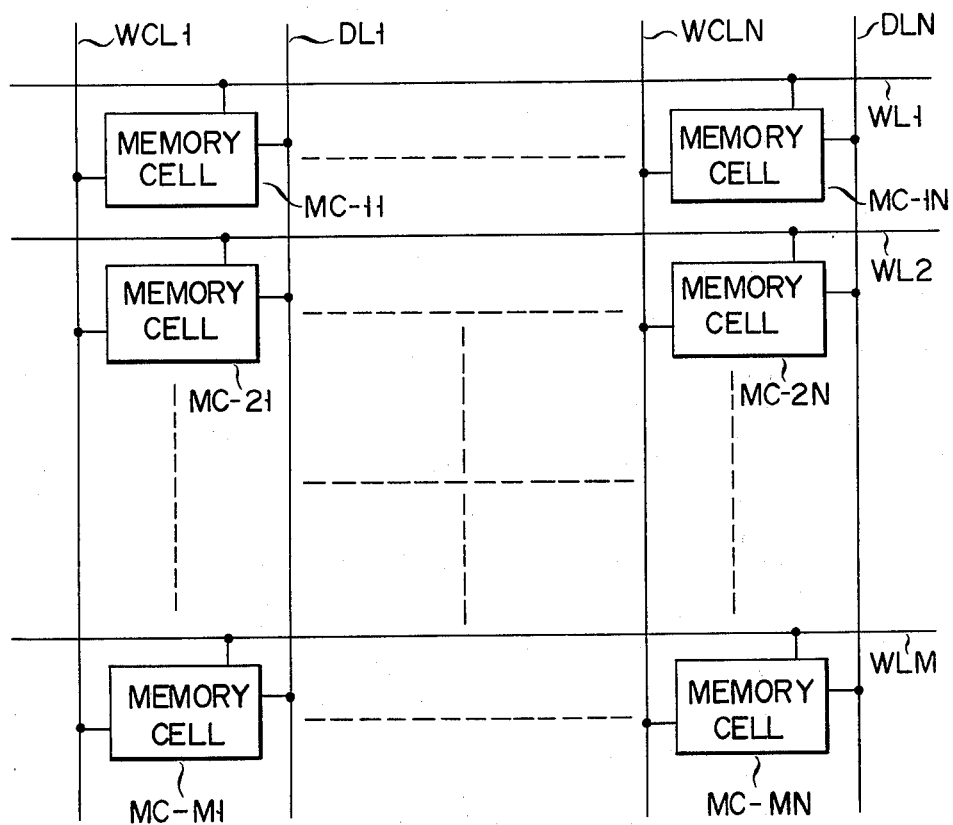

FIG. 7 is a circuit diagram of semiconductor memory cell circuit produced by assembling a plurality of the memory cells of FIG. 3 in the matrix form.

FIG. 3 shows the arrangement of a semiconductor memory circuit embodying this invention. This semiconductor memory circuit is provided with n channel MOS transistors 32 and 34 whose sources are connected to a write control line WCL. The MOS transistor 32 has its drain directly connected to the gate of the MOS transistor 34 and also to the power supply terminal $V_D$ through a resistor 36. The gate of the MOS transistor 34 is connected to a data line DL through the current path of a switching MOS transistor 38 whose gate is connected to a word line WL. The MOS transistor 34 has its drain connected to the gate of the MOS transistor 32 and also the power supply terminal $V_D$ through a load resistor 40. The resistors 36 and 40 are respectively formed of, for example, a polycrystalline silicon layer.

Description is now given with reference to FIGS. 4A to 4E. The operation of a semiconductor memory circuit shown in FIG. 3 is now described with reference to FIGS. 4A to 4E. Assume now that a threshold voltage impressed on the MOS transistors 32, 34 and 38 is expressed as $V_{TH}$, and the word line WL, when energized, is set at a high voltage level $(V_D + V_1)$ by a bootstrap action of an external circuit. In this case, $V_1 > V_{TH}$ is assumed.

Description is now given of the read operation of the subject semiconductor memory circuit, where data having a logic level "1" is stored in the memory circuit, namely, where the MOS transistor 32 is rendered nonconductive and the MOS transistor 34 is rendered conductive. During the readout mode, the write control line WCL is set at a low potential level as indicated in FIG. 4A. The data line DL is precharged to a high potential level as shown in FIG. 4B. Where, under this condition, a high level voltage (FIG. 4C) is impressed on the word line WL, then the MOS transistor 38 is rendered conductive. Since, in this case, data having a logic level "1" is stored in the memory cell, the drain voltage of the MOS transistor 32 is equal to the high voltage level $V_D$. Therefore, the data line DL is held at the high voltage $V_D$. In other words, the data line DL is sustained at the high voltage level $V_D$ (FIG. 4B), even after a high voltage is impressed on the word line WL. As a result, data having a logic level "1" is read out of the memory cell.

Conversely where data having a logic level "0" is stored in the memory cell of FIG. 3, and a high voltage (FIG. 4C) is impressed on the word line WL to render the MOS tansistor 38 conductive, then electric charges stored on the data line DL flow to the write control line WCL through the MOS transistors 38 and 32. As a result, the data line DL is set at a low potential level (FIG. 4D), and data having a logic level "0" is read out of the memory cell. Where the electric charges stored on the data line DL flow to the write control line WCL through the MOS transistors 38 and 32, then the drain voltage of the MOS transistor 32 increases (FIG. 4E) to a maximum potential level $V_M$ and later returns to the prescribed potential. This maximum voltage $V_M$ is impressed on the gate of the MOS transistor 34 tending to render the same conductive. To avoid a decline in the drain voltage of the MOS transistor 34, it is preferred to prevent the maximum voltage $V_M$ from exceeding the threshold voltage of the MOS transistor 34 so that the maximum voltage $V_M$ would not cause the MOS transistor 34 to be rendered conductive. This requirement can be easily met by properly selecting the ratio which the conductance of the MOS transistor 32 bears to that of the MOS transistor 38. Particularly when chosen to have a high resistance, the load resistor 40 constitutes a time constant circuit having a relatively large time constant in cooperation with a parasitic capacitance formed between the drain of the MOS transistor 34 and the ground. Therefore, it is important to prevent a fall in the drain voltage of the MOS transistor 34 in order to keep the same always at the constant level.

Figure 5A:
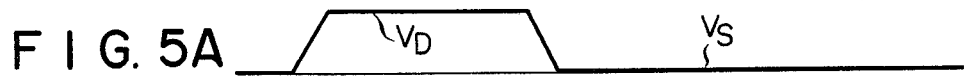
Figure 5B:
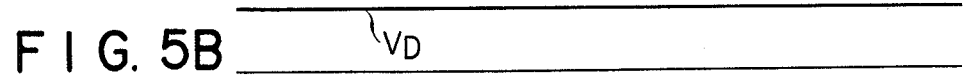
Figure 5C:
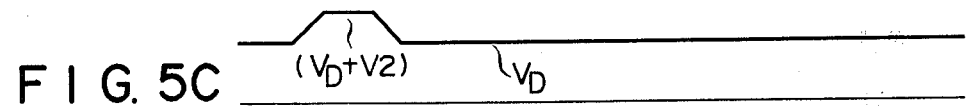
Figure 5D:
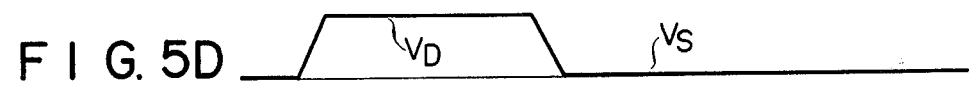
Figure 5E:
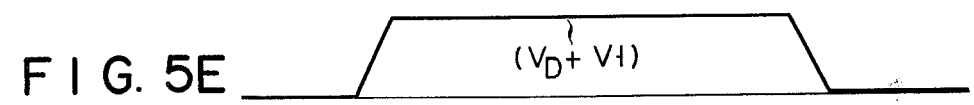

The write operation of the semiconductor memory circuit of FIG. 3 is now explained with reference to FIGS. 5A to 5L. During the write mode, the write control line WCL is set at a high potential level for a prescribed period of time (FIG. 5A). The data line DL is precharged to a high potential level (FIG. 5B). Assume now that a data having a logic level "1" is stored in the subject memory cell, namely, the MOS transistor 32 is held nonconductive, and the MOS transistor 34 is held conductive. Then, as shown in FIG. 5C, the drain voltage of the MOS transistor 32 is stepped up from the voltage level $V_D$ to the voltage level $(V_D+V_2)$ by capacitive coupling due to the gate capacitor of the MOS transistor 34 in proportion to the voltage increase of the write control line WCL from the reference voltage level $V_S$ to the high voltage level $V_D$. In this case, as shown in FIG. 5D, the drain voltage of the MOS transistor 34 is increased from the reference potential level $V_S$ to the high voltage $V_D$. Where, under this condition, a high voltage $(V_D+V_1)$ is impressed on the word line WL as shown in FIG. 5E to render the MOS transistor 38 conductive, then the drain voltage of the MOS transistor 32 falls from the voltage level $(V_2+V_2)$ to the voltage level $V_D$ as shown in FIG. 5C. Under this condition, the potential of the data line DL is determined in accordance with the logic level of data to be written in the memory cell circuit. If the data line DL is set at a high potential level $V_D$ (FIG. 5B) and when the potential on the write control line WCL is returned to the reference potential level $V_S$, then the MOS transistor 32 is rendered nonconductive, and the MOS transistor 34 is rendered conductive, causing data having a logic level "1" to be stored in the memory cell.

The write control line WCL has its potential returned to the reference potential $V_S$ when or after the potential of the data line DL is determined in accordance with the logic level of data to be written in the memory circuit.

Where the data line DL has its potential changed from a high level $V_D$ to a low level $V_S$ in order to write data having a logic level "0" (FIG. 5F), then the drain voltage of the MOS transistor 32 and the gate voltage of the MOS transistor 34 are reduced to the reference potential $V_S$, causing the MOS transistor 34 to be rendered nonconductive. After the write control voltage is decreased to the low potential $V_S$ (FIG. 5A), the drain voltage of the MOS transistor 34 is slightly reduced from the potential $V_D$ to a level $(V_D-V_3)$ as shown in FIG. 5H. This is because the drain of the MOS transistor 34 is capacitively coupled to the write control line WCL held at the reference potential by means of the gate capacitor of the MOS transistor 32. However, the voltage $(V_D-V_3)$ is kept sufficiently high to render the MOS transistor 32 conductive. The drain voltage of the MOS transistor 34 is stepped up through the resistor 40, and is brought to a level equal to the potential $V_D$ after a prescribed length of time.

Where data having a logic level "0" is stored in the memory cell of FIG. 3, the write operation is carried out in substantially the same manner as described above. Namely, where the write control line WCL is energized to a high potential level $V_D$ as shown in FIG. 5A, then the drain voltage of the MOS transistor 34 is increased from the level $V_D$ to the level $(V_D+V_2)$ as shown in FIG. 5I. The drain voltage of the MOS tansistor 32 is raised from the reference level $V_S$ to the high level $V_D$ as shown in FIG. 5J. Even where a high voltage $(V_D+V_1)$ is impressed on the word line WL under the above-mentioned condition to render the MOS transistor 38 conductive, the drain voltage of the MOS transistor 32 is retained at the high level $V_D$. At this time, the potential of the data line DL is determined in accordance with the logic level of data to be written in the memory circuit. For example, where the potential of the data line DL is held at the high level $V_D$ as shown in FIG. 5B, and the write control voltage drops from the high level $V_D$ to the low level $V_S$ as shown in FIG. 5D, then the drain voltage of the MOS transistor 32 is forcefully held at the high level $V_D$ as shown in FIG. 5J. The drain voltage of the MOS transistor 34 is gradually reduced to the low level $V_S$ as shown in FIG. 5I. As a result, the MOS transistor 32 is rendered nonconductive and the MOS transistor 34 is rendered conductive, causing data having a logic level "1" to be stored in the semiconductor memory cell.

Figure 5F:
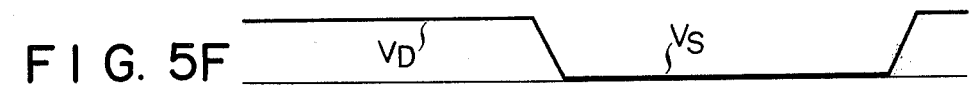
Figure 5G:
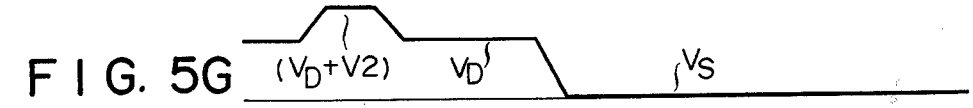
Figure 5H:
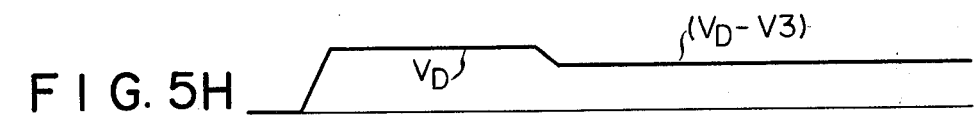
Figure 5I:
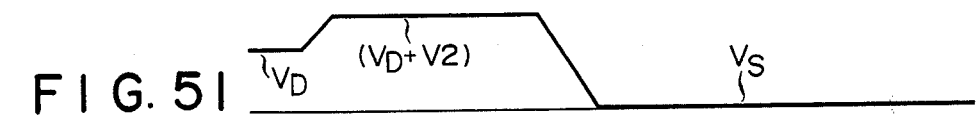
Figure 5J:
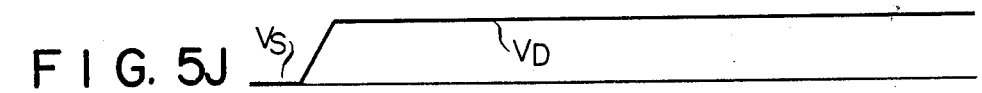
Figure 5K:
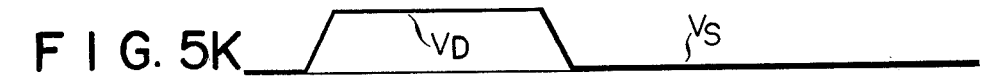
Figure 5L:
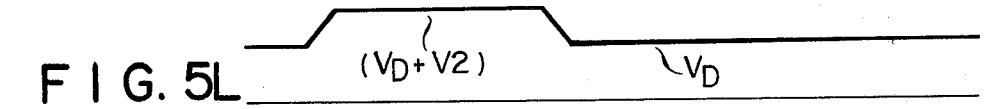

For the writing of data having a logic level "0", the word line WL is set at the high level $(V_D+V_1)$, thereafter the potential of the data line DL is decreased from the high level $V_D$ to the low level $V_S$ as shown in FIG. 5F, and the write control voltage is similarly reduced from the high level $V_D$ to the low level $V_S$ as shown in FIG. 5D. Under this condition, as shown in FIG. 5K, the drain voltage of the MOS transistor 32 falls from the high level $V_D$ to the low level $V_S$, and is forcefully retained at the low level $V_S$. At this time, the drain voltage of the MOS transistor 34 is changed from the level $(V_D+V_2)$ to the level $V_D$ as shown in FIG. 5L. Thus, the MOS transistor 32 remains conductive, and the MOS transistor 34 remains nonconductive, causing data having a logic level "0" to be stored in the memory cell.

FIG. 6 shows the arrangement of a modification of the memory circuit of FIG. 3. With this modification, the resistors 36 and 40 of FIG. 3 are respectively replaced by load transistors 42 and 44. The modification of FIG. 6 is operated in substantially the same manner as the memory circuit of FIG. 3 and ensures the same desired effect.

FIG. 7 indicates the arrangement of a semiconductor memory circuit formed of a plurality of matrix-arranged memory cells MC-11 to MC-MN, each of which comprises the MOS transistors 32, 34, 38 and resistors 36, 40 as in the memory circuit of FIG. 3. The memory cells arranged in a given row are jointly connected to a corresponding one of the word lines WL1 to WLM. The memory cells arranged in a given column are jointly connected to a corresponding one of the data lines DL1 to DLN. These word lines WL1 to WLM, data lines DL1 to DLN and write control lines WCL1 to WCLN have their operations controlled by the known control circuit (not shown), in the same manner as the word line WL, data line DL and write control line WCL used in the semiconductor memory circuit of FIG. 3 are controlled.

Assume now that in the memory circuit of FIG. 7, for example, a memory cell MC-11 is selected from among those constituting a matrix assembly. In order to read out data from the memory cell MC-11, a data line DL1 is precharged to a high potential and a high voltage ($V_D+V_1$) is impressed on a word line WL1. In this case, data stored in any other memory cell would not be affected by the impression of the high voltage ($V_D+V_1$). On the other hand, in order to write data into the selected memory cell MC-11, then the high voltage ($V_D+V_1$) is impressed on the word line WL1, a high voltage $V_D$ is supplied to the data line DL1, and the high voltage $V_D$ is applied to the write control line WCL1. At this time, the potentials on the write control lines other than the write control line WCL1 are all kept at the reference potential level $V_S$. The memory cells which are each connected to the word line WL1 and arranged in a different column from that of the memory cell MC-11 are supplied with the high voltage ($V_D+V_1$). Therefore, these memory cells are put into the same condition as that into which these memory cells are put when data is read out of the memory cell MC-11 so that data stored in these memory cells may not be destroyed. Moreover, data stored in those memory cells which are arranged in different rows and columns from those of the memory cell MC-11 will not be affected at all during the write-in operation for the memory cell MC-11. Further, the low voltage $V_S$ is impressed on the word lines connected to memory cells which are different from and are arranged in the same column as the selected memory cell MC-11. In this case, the drain voltages of the MOS transistors 32 and 34 used in each of the other memory cells are temporarily stepped up by the impression of the write control voltage $V_D$. Then, the write control voltage is brought back to a low level so that the drain voltage of the MOS transistors 32 and 34 would be set at the initial values. Thus, the data stored in the other memory cells are not affected.

This invention has been described with the foregoing embodiments. However, the invention is not limited thereto, but is applicable in many other modifications without departing from the basic technical concept of the invention.

What we claim is:

1. A semiconductor memory circuit which comprises:
   at least one memory cell;
   at least one word line;
   at least one data line segment, only a single data line segment being provided for each memory cell; and
   at least one control voltage line whose potential is set at one of different levels in accordance with a selected operation mode;
   said at least one memory cell including a first MOS transistor whose source is connected to said control voltage line, a second MOS transistor whose gate and drain are connected to the drain and gate of said first MOS transistor and whose source is connected to said control voltage line, first and second load resistive means respectively connected to the drains of said first and second MOS transistors, and a third MOS transistor whose gate is connected to said word line, and whose current path is connected between the drain of said first MOS transistor and said data line segment, the drains of said first and second MOS transistors being connected to a power supply terminal impressed with a high voltage through the corresponding first and second load resistive means, and said at least one control voltage line being held at a high voltage for a predetermined period of time in the write mode and set at a low voltage during the read mode.

2. A semiconductor memory circuit according to claim 1, wherein said first and second load resistive means are formed of MOS transistors.

3. A semiconductor memory circuit according to claim 1, wherein said first and second load resistive means are respectively formed of a polycrystalline silicon layer.

4. A semiconductor memory circuit which comprises:
   a plurality of matrix-arranged memory cells, each of said memory cells including a first MOS transistor, a second MOS transistor whose source, drain and gate are respectively connected to the source, gate and drain of said first MOS transistor, first and second load resistive means respectively connected to the drains of said first and second MOS transistors, and a third MOS transistor whose current path is connected at one end to the drain of said first MOS transistor;
   a plurality of word lines, each of said word lines being connected in common to the gate of the third MOS transistor of each respective memory cell arranged in the same row;
   a plurality of data lines, only a single data line being provided for those memory cells which are arranged in the same column and each of said plurality of data lines being connected in common to the other end of the current path of each of the third MOS transistors of the respective memory cells arranged in the same column; and
   a plurality of control voltage lines, each of said control voltage lines being connected in common to the sources of said first and second MOS transistors of the respective memory cells arranged in the same column, the potential of each control voltage line being set at one of different levels in accordance with a selected operation mode, the drains of said first and second MOS transistors of each of said memory cells being connected to a power supply terminal impressed with a high voltage through the corresponding first and second resistive means, and said at least one control voltage line being held at a high voltage for a predetermined period of time in the write mode and set at a low voltage during the read mode.

5. A semiconductor memory circuit according to claim 4, wherein said first and second load resistive means are formed of MOS transistors.

6. A semiconductor memory circuit according to claim 4, wherein said first and second load resistive means are respectively formed of a polycrystalline silicon layer.

* * * * *